United States Patent [19]
Matsumoto et al.

[11] Patent Number: 4,893,296
[45] Date of Patent: Jan. 9, 1990

[54] OPTICAL PICKUP DEVICE

[75] Inventors: Yoshiyuki Matsumoto; Hidehiro Kume; Koji Mitsumori; You Yoshitoshi, all of Tokyo; Etsufumi Yamamoto, Kanagawa; Hiroshi Oinoue, Tokyo, all of Japan

[73] Assignee: Sony Corporation, Tokyo, Japan

[21] Appl. No.: 219,915

[22] Filed: Jul. 15, 1988

[30] Foreign Application Priority Data

Jul. 30, 1987 [JP] Japan .................................. 62-190788

[51] Int. Cl.$^4$ .............................................. G11B 7/00
[52] U.S. Cl. .................................... 369/112; 369/122
[58] Field of Search ...................... 369/44, 45, 46, 112, 369/100, 109, 121, 122; 350/96.11; 250/201 DF

[56] References Cited

U.S. PATENT DOCUMENTS

| | | | |
|---|---|---|---|
| 4,716,559 | 12/1987 | Hine | 369/121 |
| 4,733,065 | 3/1988 | Hoshi et al. | 369/45 |
| 4,823,331 | 4/1989 | Yoshitoshi et al. | 369/112 |

FOREIGN PATENT DOCUMENTS

| | | | |
|---|---|---|---|
| 60-103316 | 6/1985 | Japan | 350/96.11 |
| 62-86334 | 4/1987 | Japan | 350/96.11 |

Primary Examiner—Donald McElheny, Jr.
Attorney, Agent, or Firm—Philip M. Shaw, Jr.

[57] ABSTRACT

An optical pickup device having a semiconductor laser element mounted on a substrate, a photo detector formed on the substrate to receive a laser beam emitted from the semiconductor laser element and an optical element mounted on the substrate to cover the photo detector to branch the direction of optical path of the laser beam, the optical element having its face opposing the semiconductor laser element formed as an inclined face on which a semitransparent reflection film is deposited. The optical path branching optical element is provided with preventing means by which, of laser beams incident on the optical element, a laser beam reflected and/or scattered within the optical element is prevented from irradiating the photo detector.

14 Claims, 4 Drawing Sheets

OPTICAL PICKUP DEVICE

BACKGROUND OF THE INVENTION

1. Field of the Invention

The present invention relates generally to optical pickup devices and more particularly to an optical pickup device in which a light emitting element and a light receiving element are formed integrally on a semiconductor substrate.

2. Description of the Prior Art

Optical heads with various structures have been proposed so far to detect an information from information pits formed on the surface of a compact disc (CD) or the like. A perspective view forming FIG. 1 illustrates a structure of an optical pickup device employing a composite light emitting and/or light receiving element that we have previously proposed as Japanese Patent Application No. 61-38575.

As FIG. 1 shows, there is provided an optical head 1 in which a first photo detector 3 made of a so-called PIN diode or the like is formed, for example, on the left-hand side half of a major surface 2A of a rectangular semiconductor substrate 2 made of silicon or the like as a light receiving element. The first photo detector 3 is formed of, for example, two sets of photo detectors 3a and 3b, each of which is divided to provide three photo detecting portions. A second photo detector 4 made of a PIN diode or the like for monitoring is formed on the right-hand side half of the major surface 2A of the semiconductor substrate 2 as a light receiving element, if necessary. Between the first and second photo detectors 3 and 4, a light emitting element 5 such as a semiconductor laser chip or the like is directly soldered to the major surface 2A of the semiconductor substrate 2. Also, there is provided an optical path branching part, i.e., a prism 6. This prism 6 is trapezoidal in cross section and is mounted on the major surface 2A of the semiconductor substrate 2 to cover the first photo detector 3, thus a composite light emitting/light receiving element 1a being formed. The prism 6 has a face 6a opposing to the light emitting point of the active layer in the semiconductor laser chip 5. This face 6a is formed as a semitransparent reflection face. Meanwhile, in a face 6b of the prism 6 contacting with the semiconductor substrate 2, other face than the face contacting with the photo detectors 3a and 3b and a face 6c of the prism 6 opposing the face 6b are each formed as a reflection face.

With the above-mentioned arrangement, a laser beam 7a emitted from the active layer of the semiconductor laser chip 5 is reflected on the semitransparent reflection face 6a of the prism 6 and is then irradiated on an optical disc through an objective lens (not shown) as an incident laser beam 7b. The light of the incident laser beam 7b reflected on the optical disc travels through the face 6a of the prism 6 and becomes incident on the first set of photo detector 3a. The light passed through the face 6a is reflected by a semitransparent layer (not shown) formed between the prism 6 and the first set of photo detector 3a and is then reflected on the face 6c of the prism 6 to become incident on the second set of photo detector 3b, whereby the data corresponding to the information pits on the optical disc are detected. A laser beam 7c is emitted from an opposite active layer of the semiconductor laser chip 5 for monitoring.

In the abovementioned composite light emitting/light receiving element 1a, a part of the laser beam, which is emitted from the semiconductor laser chip 5, travels through the prism 6 and directly becomes incident on the first photo detector 3 and it, becomes an undesired light (or stray light) which brings about a noise to the detecting signal. Therefore, We have previously proposed various means for eliminating the aforesaid undesired light.

From the experimental results, it was noted that while the undesired light incident on the prism 6 is removed in the conventional composite light emitting/light receiving element 1a, other kind of undesired light is produced to exert a bad influence upon the detecting signal that the first photo detector 3 produces.

Referring to FIG. 2, let us now explain why such other kind of undesired light is produced. FIG. 2 is a fragmentary cross-sectional side view taken through the line II—II of FIG. 1, looking in the direction represented by an arrow A. Except for the semitransparent reflection face 6a of the prism 6 formed on the major surface 2A of the semiconductor substrate 2 to cover the first photo detector 3, left, right and rear side wall faces 6d, 6e and 6f are formed as such faces that are not calendered. For example, they are formed as smoked-glass faces. For this reason, a part of the laser beam 7a emitted from the active layer of the semiconductor laser chip 5 travels through the semitransparent reflection face 6a and is then reflected and/or scattered on the side wall faces 6d, 6e and 6f in the prism 6. Thus, as shown by reflected and/or scattered laser beams 8 represented as broken lines in FIG. 2, an undesired light again becomes incident on the light receiving faces of the photo detectors 3a and 3b with a small incident angle $\theta 1$. Such an undesired light is superimposed upon an RF signal from the first photo detector 3 as a DC offset signal, thereby to exert a bad influence on the detecting signal. Other reason that there exist much undesired light beams which are repeatedly reflected and/or scattered within the prism 6 is that the refractive index of the material forming the prism 6 is larger than the refractive index of the air and hence the undesired light beams are not radiated from the prism 6 to the air.

OBJECTS AND SUMMARY OF THE INVENTION

Accordingly, it is an object of the present invention to provide an improved optical pickup device.

It is another object of the present invention to provide an optical pickup device which can produce a stable detecting signal from a photo detector thereof.

It is a further object of the present invention to provide an optical pickup device which can be manufactured at low cost.

According to an aspect of the present invention, there is provided an optical pickup device comprising:
(a) a substrate;
(b) a semiconductor laser element mounted on said substrate;
(c) a photo detector for receiving a laser beam emitted from said semiconductor laser element formed on said substrate;
(d) an optical path branching optical element fixed to said substrate on said photo detector and of which the face opposing said semiconductor laser element is formed as an inclined face on which is deposited a semitransparent reflection film; and
(e) preventing means provided on said optical element for preventing, of laser beams incident on said optical element, reflected and/or scattered laser beams within said optical element from being introduced into said photo detector.

The above, and other objects, features and advantages of the present invention will become apparent from the following detailed description of the preferred embodiments taken in conjuction with the accompanying drawings, throughout which like reference numerals identify like elements and parts.

DETAILED DESCRIPTION OF THE PREFERRED EMBODIMENTS

Now, embodiments of an optical pickup device according to the present invention will hereinafter be described in detail with reference to FIGS. 3 to 8.

Figure 1:
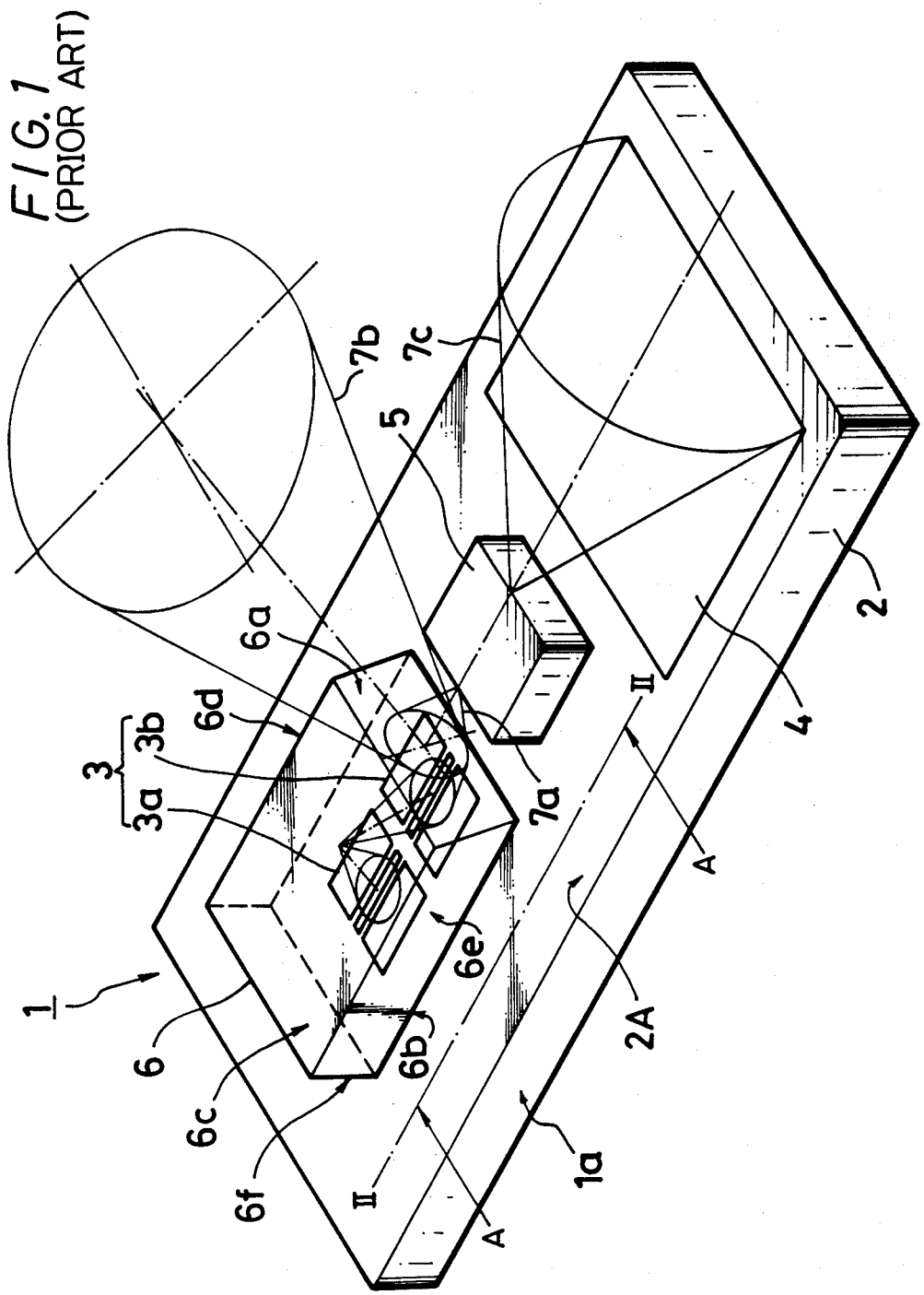
FIG. 1 is a perspective view of an example of a conventional optical pickup device.
Figure 2:
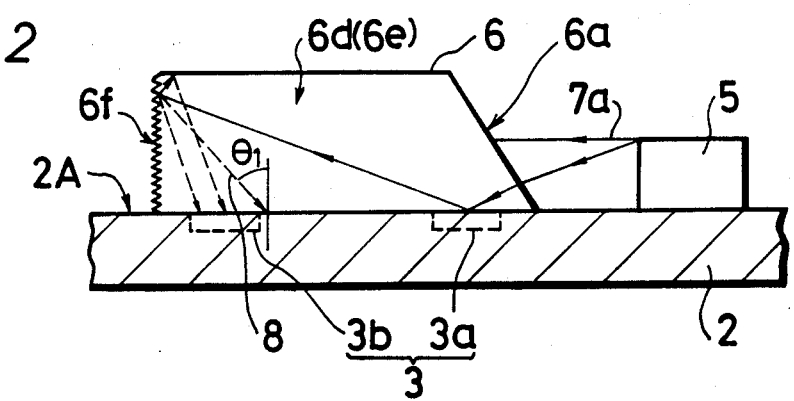
FIG. 2 is a cross-sectional side view taken through the line II—II in FIG. 1, looking in the direction represented by arrow A.
Figure 3:
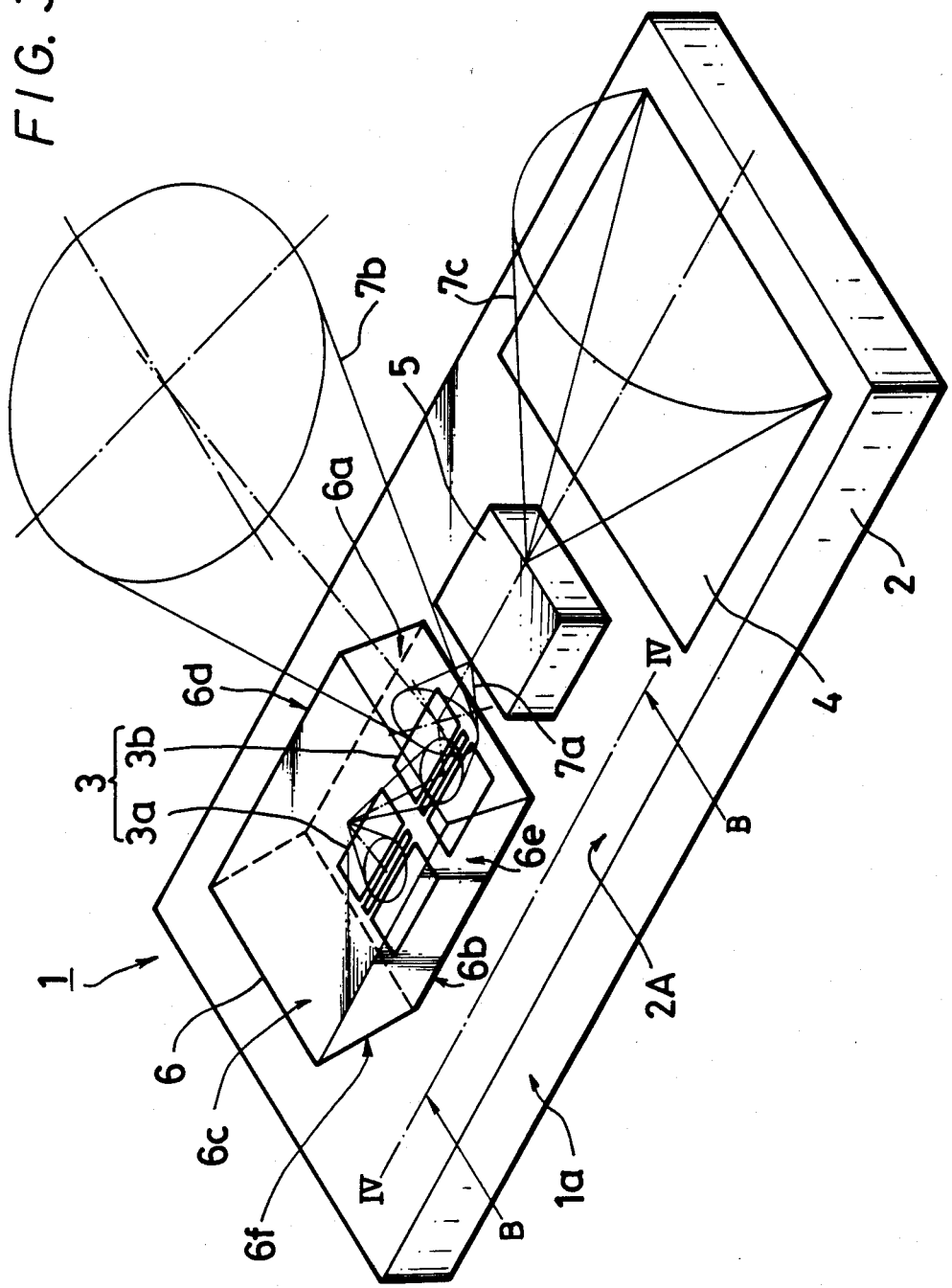
FIG. 3 is a perspective view illustrating an embodiment of an optical pickup device according to the present invention.

A perspective view forming FIG. 3 illustrates an embodiment of an optical pickup device or so-called optical head which employs a composite light emitting/light receiving element of the present invention. In FIG. 3, like parts corresponding to those of FIGS. 1 and 2 are marked with the same references and therefore need not be described in detail.

Referring to FIG. 3, the optical assembly part for branching the optical path of laser beam, i.e., prism 6 of the composite light emitting/light receiving element 1a is mounted on the first photo detectors 3a and 3b which are used as the light receiving elements. The semiconductor laser chip 5 is used as the light emitting element and the laser beam 7a emitted therefrom is incident on the semitransparent reflection face 6a of the prism 6. The prism 6 used in the present invention forms undesired light preventing means by changing the shape of the rear side wall face 6f thereof, thus to solve such a problem of the prior art that the undesired light caused by the repetitive reflection and/or scattering within the prism 6 deteriorates the sensitivity of the detecting signals derived from the first photo detectors 3a and 3b, increasing the error in detection.

Figure 4:
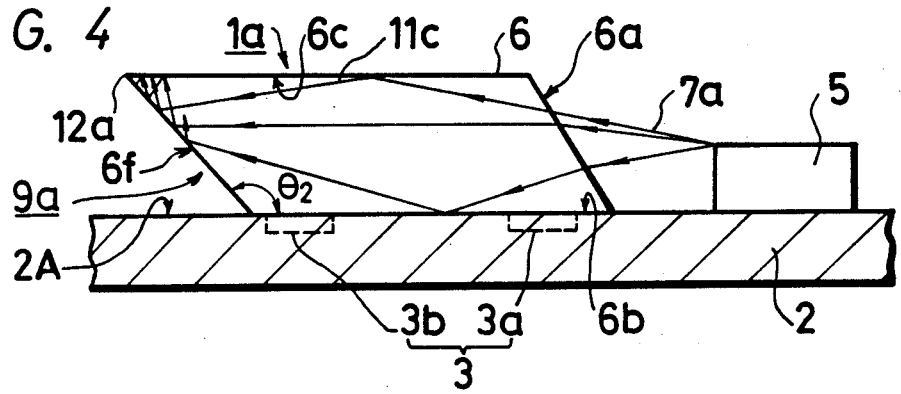
FIG. 4 is a cross-sectional side view taken through the line IV—IV in FIG. 3.

The arrangement of the above-mentioned undesired light preventing means will be described with reference to FIG. 4 that forms a fragmentary cross-sectional view taken through the line IV—IV in FIG. 3. The prism 6 is formed as a shape of substantially lozenge as viewed from the side as shown in FIG. 4 and a rising angle $\theta 2$ of the rear side wall face 6f of the prism 6 from the major surface 2A of the substrate 2 is selected to be an obtuse angle. If the prism 6 is constructed as described above, the laser beam 7a emitted from the semiconductor laser chip 5 reaches the semitransparent reflection face 6a of the prism 6 and a part of the laser beam 7a is introduced through the face 6a into the prism 6. Depending on the light emitting angle of the laser beam 7a from the semiconductor laser chip 5, within the prism 6, there are different optical paths, i.e., an optical path 11a in which the laser beam reaches the lower wall face 6a of the prism 6 and is then reflected thereon to reach the rear side wall face 6f, an optical path 11b in which the laser beam reaches directly to the rear side wall face 6f of the prism 6, an optical path 11c in which the laser beam reaches the upper wall face 6c of the prism 6 and is then reflected thereon to reach the rear side wall 6f of the prism 6 and so on. The laser beams traveling through the prism 6 and reaching to the rear side wall face 6f along the optical paths 11a to 11c are repeatedly reflected between the upper wall face 6c and the rear side wall face 6f so as to be radiated outside the prism 6 from its upper edge 12a, thus constructing undesired light preventing means 9a.

Figure 5:
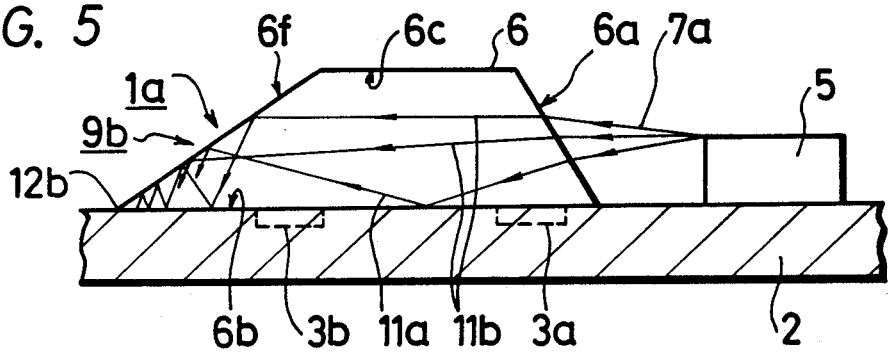
FIGS. 5 and 6 are respectively fragmentary cross-sectional side views used to explain other embodiments of the optical pickup device according to the present invention.
Figure 6:
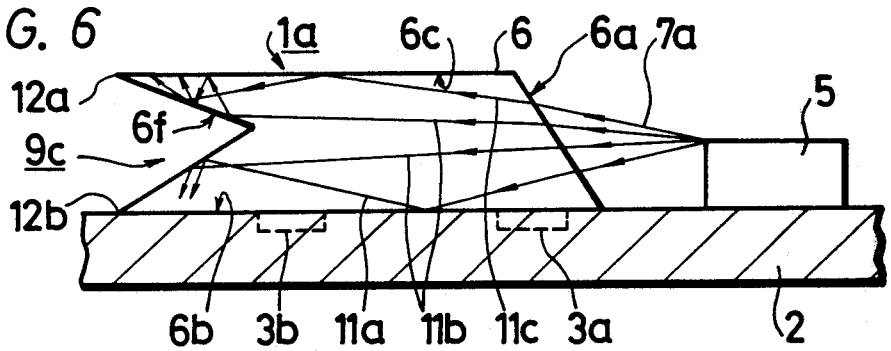
Figure 7:
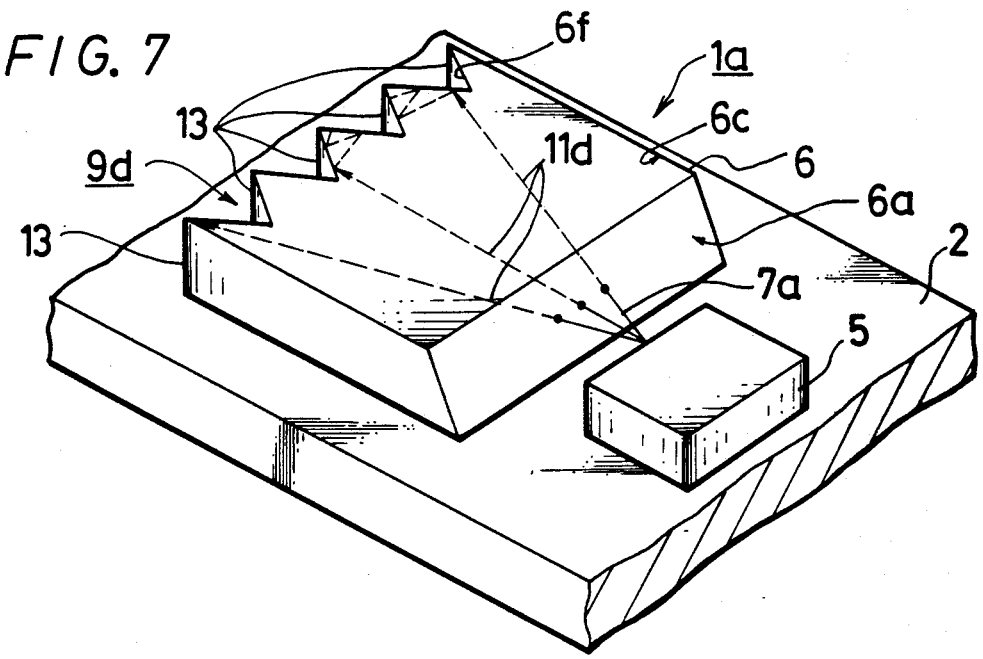
FIG. 7 is a perspective view used to explain a further embodiment of the present invention.

Other embodiments of the optical pickup device or its composite light emitting/light receiving element 1a according to the present invention will be described with reference to FIGS. 5 to 7. Particularly in the embodiments, undesired light preventing means 9b to 9d arranged on the basis of the above-mentioned principle will be described. In this case, FIGS. 5 and 6 are respectively fragmentary cross-sectional side views showing embodiments of the optical pickup device or its composite light emitting/light receiving element 1a of the present invention. FIG. 7 is a perspective view of a further embodiment of the composite light emitting/light receiving element 1a.

Referring to FIG. 5, the prism 6 is formed as trapezoid as viewed from the side of composite light emitting/light receiving element 1a. In this case, the undesired light is radiated outside the prism 6 from its lower edge 12b. That is, undesired light preventing means 9b is constructed on the rear side wall face 6f of the prism 6.

Referring to FIG. 6, a triangular-shaped cut-away is formed on the rear side wall face 6f of the prism 6 in its thickness direction, as viewed from the side of the composite light emitting/light receiving element 1a, thereby to radiate the undesired light outside the prism 6 from its upper and lower edges 12a and 12b, thus constructing undesired light preventing means 9c.

Referring to FIG. 7 which is the perspective view of a further embodiment of the composite light emitting/light receiving element 1a according to this invention, a plurality of triangular-shaped cut-aways are formed on the rear side wall face 6f of the prism 6 in its width direction to reflect the light beams within the respective triangular-shaped cut-away portions, whereby the undesired light beams 11d are radiated outside the prism 6 from its edge 13 along the apex of each triangular-shaped cut-away portion, thus constructing the undesired light preventing means 9d.

Figure 8A:
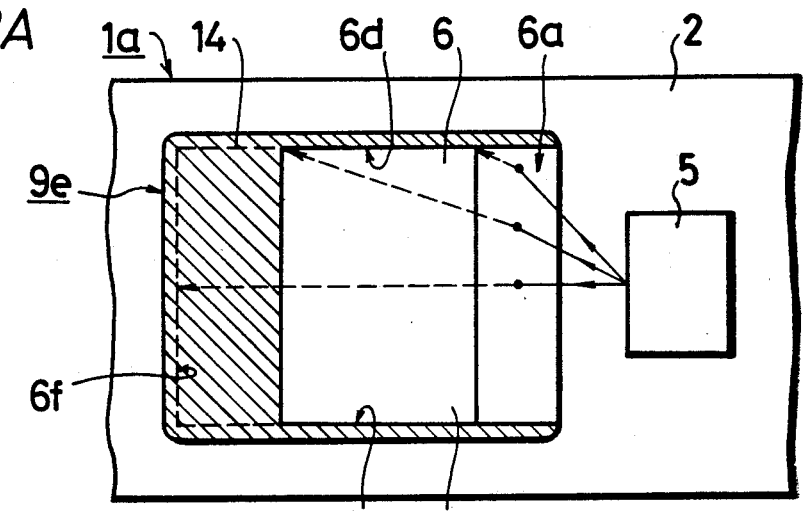
FIG. 8A is a plan view of a yet further embodiment of the optical pickup device according to the present invention.
Figure 8B:
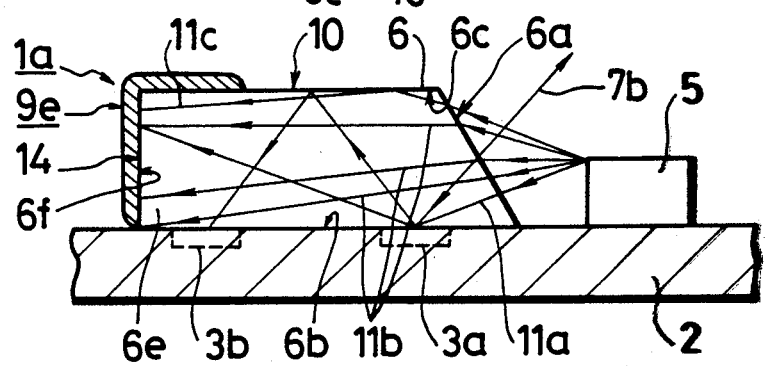
FIG. 8B is a fragmentary cross-sectional side view of FIG. 8A.

FIGS. 8A and 8B illustrate a further embodiment of the composite light emitting/light receiving element 1a according to the present invention. FIG. 8A is a plan view thereof and FIG. 8B is a fragmentary cross-sectional side view thereof similarly to FIG. 4.

In FIGS. 8A and 8B, the shape of the rear side wall face 6f of the prism 6 is not modified at all as compared with that shown in FIGS. 1 and 2 but a light absorption material 14 is coated on the left and right side wall faces 6d and 6e and the rear side wall face 6f of the prism 6. The kind of this light absorption material 14 is selected in accordance with an oscillation wavelength of the laser beam emitted from the semiconductor laser chip 5. For example, a black paint or the like is coated on the left and right side wall faces 6d and 6e and the rear side wall face 6f with a predetermined coating pattern. Since an area 10 of the upper face 6c of the prism 6 is necessary for reflecting the signal detecting light which results from reflecting the laser beam 7b on the optical disc so as to become incident on the photo detector element 3b, the light absorption material 14 is not coated on the area 10 of the upper face 6c of the prism 6 which reflects such light beam as mentioned above. The light absorption material 14 may be coated on the rear area of the upper face 6c of the prism 6 as illustrated in FIG. 8A.

Further, the light absorption material 14 may be such a material that has the same refractive index as that of the prism 6. If the kind of the light absorption material 14 is selected as described above, the reflection on the interface between the prism 6 and the light absorption material 14 can be removed.

According to the above-mentioned arrangement, almost all of the incident laser beams propagating along the optical paths 11a to 11c within the prism 6, which will become the undesired light beams, can be absorbed by the light absorption material 14, thus forming the undesired light preventing means 9e.

According to the present invention, as set forth above, since the prism is provided with the undesired light beam preventing means which is formed by changing the shape of the rear side wall face of the prism or coating the light absorption material on the side wall faces and so on, thereby to avoid the undesired light reflected and/or scattered within the prism, the detecting signal and the undesired light do not have to be separated electrically. Thus, without the electric circuit, the optical pickup device or the composite light emitting/light receiving element of the invention can prevent the undesired light and can produce the stable detecting signal from its photo detecting means. Also, the optical pickup device, or the composite light emitting/light receiving element of the invention can be manufactured at low cost.

It should be understood that the above description is presented by way of example on the preferred embodiments of the invention and it will be apparent that many modifications and variations thereof could be effected by one with ordinary skill in the art without departing from the spirit and scope of the novel concepts of the invention so that the scope of the invention should be determined only by the appended claims.

We claim as our invention:

1. An optical pickup device comprising:
   (a) a substrate;
   (b) a semiconductor laser element mounted on said substrate;
   (c) a photo detector for receiving a laser beam emitted from said semiconductor laser element formed on said substrate;
   (d) an optical path branching optical element fixed to said substrate on said photo detector and of which the face opposing said semiconductor laser element is formed as an inclined face on which is deposited a semitransparent reflection film; and
   (e) preventing means provided on said optical element for preventing, of laser beams incident on said optical element, reflected and/or scattered laser beams within said optical element from being introduced into said photo detector.

2. An optical pickup device according to claim 1, in which said preventing means is formed by forming a rear side wall face of said optical element as a predetermined shape.

3. An optical pickup device according to claim 2, in which the rear side wall face of said optical element is formed so as to reflect, of laser beams incident on said optical element, the reflected and/or scattered laser beam within said optical element in a multiplexed fashion.

4. An optical pickup device according to claim 3, in which said preventing means is arranged to radiate, of the laser beams incident on said optical element, the laser beam reflected and/or scattered within said optical element from an upper edge of said rear side wall face of said optical element.

5. An optical pickup device according to claim 4, in which said preventing means is formed by forming said optical element as substantially lozenge-shape.

6. An optical pickup device according to claim 5, in which a rising-up angle of the rear side wall face of said optical element is selected as an obtuse angle.

7. An optical pickup device according to claim 3, in which said preventing means is arranged to radiate, of the laser beams incident on said optical element, the laser beam reflected and/or scattered within said optical element from a lower edge of said rear side wall face of said optical element.

8. An optical pickup device according to claim 7, in which said preventing means is formed by forming said optical element as a trapezoidal shape.

9. An optical pickup device according to claim 3, in which said preventing means is arranged to radiate, of the laser beams incident on said optical element, the laser beam reflected and/or scattered within said optical element from upper and lower edges of said rear side wall face of said optical element.

10. An optical pickup device according to claim 3, in which said preventing means is formed by forming a triangular-shaped cut-away portion on said rear side wall face of said optical element in its thickness direction.

11. An optical pickup device according to claim 3, in which said preventing means is formed by forming a plurality of triangular-shaped cut-away portions on said rear side wall face of said optical element in its width direction.

12. An optical pickup device according to claim 3, in which said preventing means is a light absorption material coated at least on left, right and rear side wall faces of said optical element.

13. An optical pickup device according to claim 12, in which said light absorption material has the same refractive index as that of said optical element.

14. An optical pickup device according to claim 13, in which said light absorption material is made of a material which absorbs a laser beam having a wavelength emitted from said semiconductor laser element.

* * * * *